(12) United States Patent
Kuo (10) Patent No.: US 7,778,081 B2
(45) Date of Patent: Aug. 17, 2010

(54) METHOD FOR PERFORMING OPERATIONS BY APPLYING PERIODIC VOLTAGE PULSES TO CONTROL GATE OF AN ONO MEMORY CELL

(75) Inventor: Ming-Chang Kuo, Lugang Township (TW)

(73) Assignee: MACRONIX International Co., Ltd., Hsinchu (TW)

( * ) Notice: Subject to any disclaimer, the term of this patent is extended or adjusted under 35 U.S.C. 154(b) by 343 days.

(21) Appl. No.: 11/945,181

(22) Filed: Nov. 26, 2007

(65) Prior Publication Data

US 2009/0135653 A1  May 28, 2009

(51) Int. Cl.
*G11C 11/34* (2006.01)
*G11C 16/04* (2006.01)

(52) U.S. Cl. .................. 365/185.19; 365/185.18; 365/185.24; 365/185.28

(58) Field of Classification Search ............ 365/185.18, 365/185.19, 185.24, 185.28
See application file for complete search history.

(56) References Cited

U.S. PATENT DOCUMENTS

| | | | | |
|---|---|---|---|---|
| 6,519,182 | B1 * | 2/2003 | Derhacobian et al. .. | 365/185.18 |
| 7,209,390 | B2 * | 4/2007 | Lue et al. ............... | 365/185.19 |
| 7,515,465 | B1 * | 4/2009 | Wang .................... | 365/185.03 |

* cited by examiner

*Primary Examiner*—VanThu Nguyen
(74) *Attorney, Agent, or Firm*—Jianq Chyun IP Office

(57) ABSTRACT

A method for performing operations on a memory cell is described. The memory cell includes a substrate, a first doping region and a second doping region. The first doping region and the second doping region are formed on the substrate with a channel region therebetween. A dielectric layer is formed above the channel region and a conductive gate is formed over the dielectric layer. The method includes applying a first constant voltage for a first period to the conductive gate followed by applying a second constant voltage for a second period to the conductive gate repeatedly. The value of the first constant voltage is different from the value of the second constant voltage. A third constant voltage and a fourth voltage are applied to the first doping region and the second doping region respectively.

21 Claims, 11 Drawing Sheets

METHOD FOR PERFORMING OPERATIONS BY APPLYING PERIODIC VOLTAGE PULSES TO CONTROL GATE OF AN ONO MEMORY CELL

TECHNICAL FIELD

The present application relates to a method for performing operations on a flash multi-level memory cell.

BACKGROUND

Figure 1:
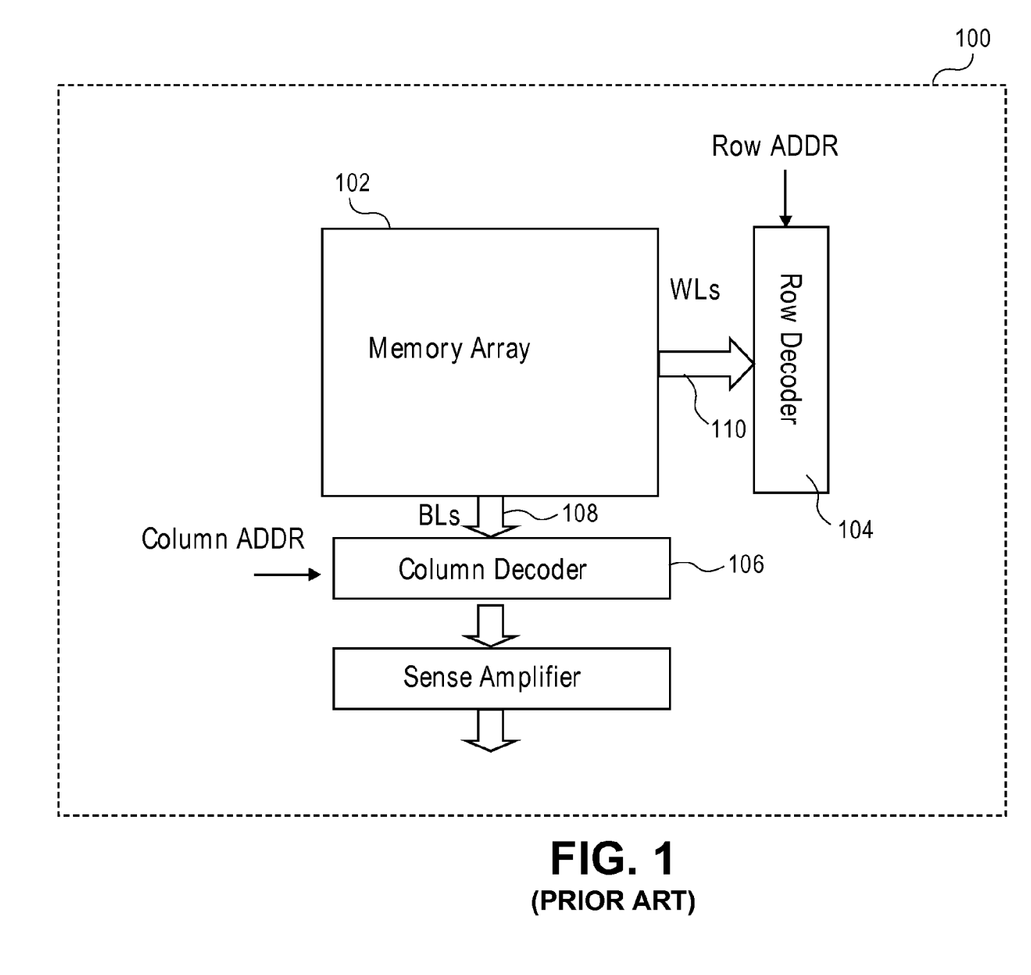
FIG. 1 illustrates a block diagram of a memory device.

Memory devices for non-volatile storage of information are in widespread use in a myriad of applications today. In general, as illustrated in FIG. 1, memory devices contain a memory array 102 of memory cells for storing data, a row decoder 104, and a column decoder 106 coupled to the memory array 102 for accessing the memory array 102 in response to an external address. Generally, drain regions of memory cells located in a column are connected to a common bit line (BL) 108 and control gates of memory cells in a row are connected to a common word line (WL) 110. Examples of non-volatile memory cells include read only memory (ROM), programmable read only memory (PROM), erasable programmable read only memory (EPROM), electrically erasable programmable read only memory (EEPROM), and flash EEPROM.

Figure 2:
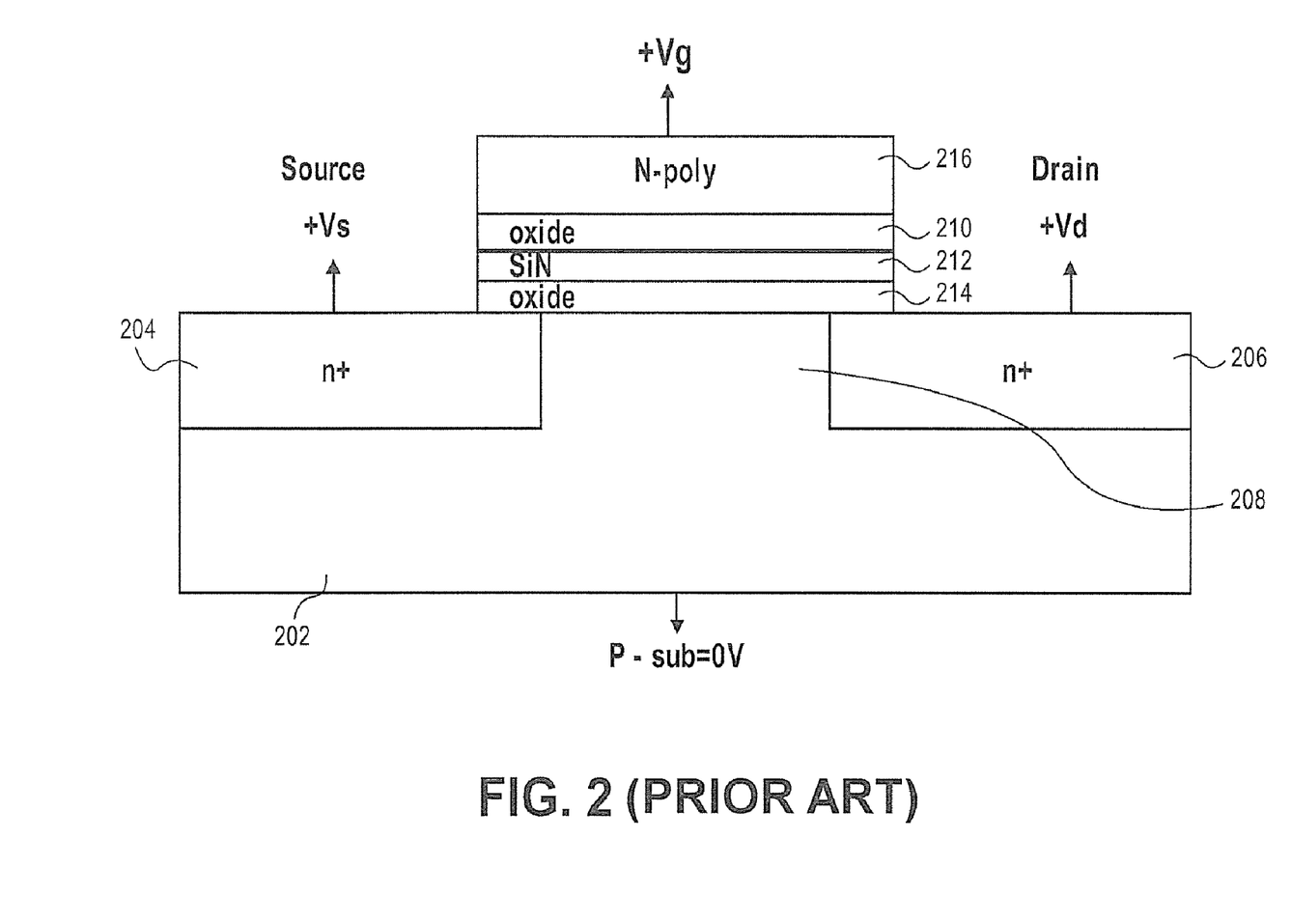
FIG. 2 illustrates a cross-sectional view of one type of a flash memory cell.

FIG. 2 illustrates a sectional view of one type of a flash memory cell. As shown in FIG. 2, the flash memory cell includes an n-type source region 204 and an n-type drain region 206 formed in a p-type silicon substrate 202. The region between the source region 204 and the drain region 206 is known as a channel region 208 of the memory cell. A dielectric layer including a top oxide layer 210, a nitride layer 212 and a bottom oxide layer 214 are formed above the channel region 208. A conductive layer 216 functioning as a control gate is formed over the dielectric layer.

Typically, operations for accessing data stored in the flash memory cell include programming, reading and/or erasing operations. Programming operations (i.e., charge injection) on a flash memory cell may be carried out by various methods, such as channel hot electron (CHE) injection or Fowler-Nordheim (FN) injection, both of which inject electrons into the nitride layer 212. Erasing operations (i.e., charge removal) may be accomplished by band-to-band hot hole tunneling (BTBHHT) or Fowler-Nordheim (FN) injection. To erase the memory cell, the electrons previously trapped in the nitride layer 212 may be neutralized either by moving electrons out of the nitride layer 212 or by transferring holes into the nitride layer 212.

SUMMARY OF INVENTION

In one embodiment of the invention, a memory cell includes a substrate, a first doping region and a second doping region which are formed on the substrate with a channel region therebetween, a dielectric layer formed over the channel region, and a conductive layer formed over the dielectric layer. A method for performing operations on the memory cell includes applying a first constant voltage to the conductive gate for a first period followed by applying a second constant voltage to the conductive gate for a second period repeatedly. The value of the first constant voltage is different from the value of the second constant voltage. A third constant voltage is applied to the first doping region and a fourth constant voltage is applied to the second doping region.

In another embodiment of the invention, a memory cell includes a substrate, a first doping region and a second doping region which are formed on the substrate with a channel region therebetween, a dielectric layer formed over the channel region, and a conductive layer formed over the dielectric layer. A method for performing operations on the memory cell includes applying a first constant voltage to the conductive gate for a first period followed by applying a second constant voltage to the conductive gate for a second period repeatedly. The value of the first constant voltage is different from the value of the second constant voltage.

BRIEF DESCRIPTION OF DRAWINGS

The foregoing summary, as well as the following detailed description of the invention, will be better understood when read in conjunction with the appended drawings. For the purpose of illustrating the invention, there are shown in the drawings examples which are presently preferred. It should be understood, however, that the invention is not limited to the precise arrangements and instrumentalities shown. In the drawings.

DETAILED DESCRIPTION

Reference will now be made in detail to the present examples of the invention illustrated in the accompanying drawings. Wherever possible, the same reference numbers will be used throughout the drawings to refer to the same or like elements.

In various embodiments of the invention, a first constant voltage is applied to the control gate for a first period followed by a second constant voltage applied to the control gate for a second period repeatedly to prevent the memory cell from being over-programmed and over-erased.

Figure 3A:
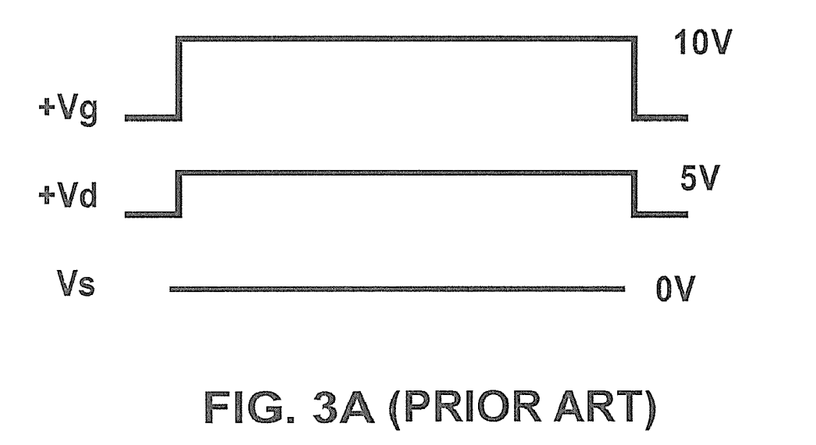
FIG. 3A and FIG. 3B are timing diagrams of the voltages applied to the control gate and source/drain region according to conventional methods for programming.
Figure 3B:
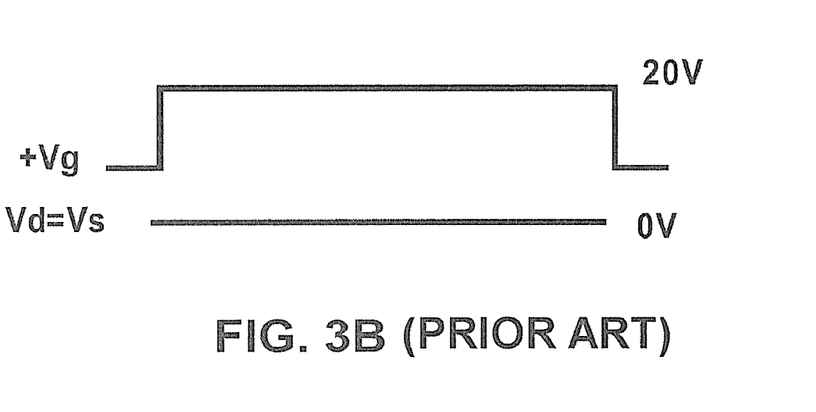
Figure 3C:
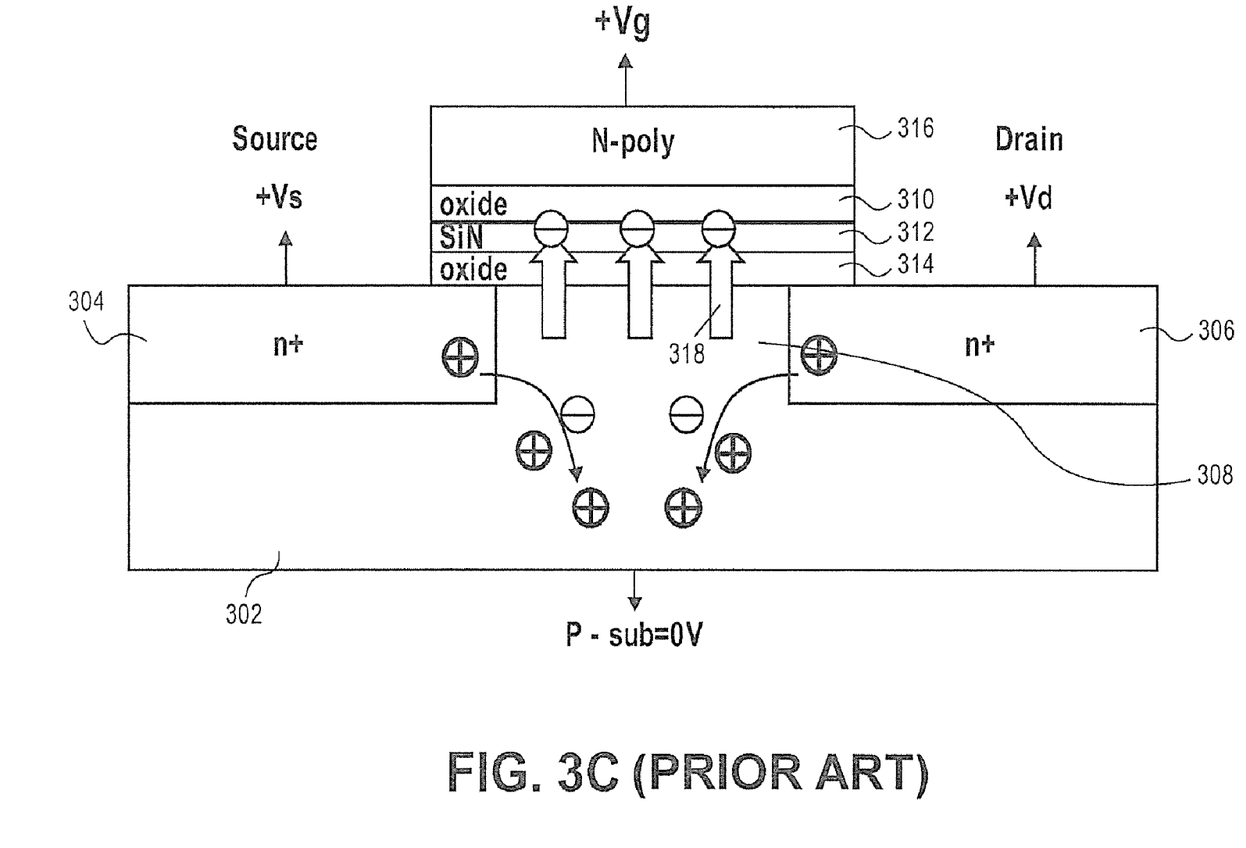
FIG. 3C illustrates a cross-sectional view of a flash memory device during a programming operation.

To program the memory cells, conventionally, a constant positive voltage is applied to the control gate. Techniques such as channel hot electron (CHE) injection, with reference to the timing diagrams shown in FIG. 3A, involves applying a constant voltage (e.g., 5V) to the drain region, and a relatively larger constant voltage to the control gate (e.g., 10V) while keeping the source region at a ground level or a zero voltage in relation to the voltages applied to the control gate and the drain region. In another programming method as shown in FIG. 3B, Fowler-Nordheim (FN) injection requires that the voltage applied to the control gate be kept constant (e.g., 20V) and both source and drain regions be grounded. During a programming operation, as illustrated in FIG. 3C, electron-hole pairs are generated in the channel region 308 of the flash memory cell. The relatively larger constant voltage applied to the control gate 316 therefore raises the voltage of the nitride layer 312 to a high level, which may attract electrons flowing through the channel region 308 into the nitride layer 312, as indicated by direction arrows 318. When sufficient electrons accumulate in the nitride layer 312, the nitride layer 312 becomes negatively charged and a desired threshold voltage of the memory cell is achieved.

In multi-level memory cells, a plurality of memory cells may be programmed simultaneously. Programming speed of each memory cell (i.e., the rate of injecting the electrons into the nitride layer) may vary based on various physical conditions (e.g., the thickness of the nitride layer, the area of the nitride layer overlapping the source region, etc.). These physical conditions may be different from memory cell to memory cell depending on the manufacturing process. The fastest memory cells may have the lowest energy barrier to overcome between the nitride layer and the drain region, while the slowest memory cells, conversely, have the highest energy barrier to overcome between the nitride layer and the drain region. Under this condition, the distribution of the programmed threshold voltage $V_T$ may become wide, with the result that the fastest memory cell may be over-programmed. Therefore, there is a need for controlling the threshold voltage distributions to prevent over-programming. The tighter the threshold voltage distribution, the easier it is to unmistakably read the memory cells according to the reading operation mechanism. In addition, the tight threshold voltage is even more important for the multi-level memory cells, because the read process needs to distinguish between the different voltage threshold distributions without resulting in the errors.

Figure 4A:
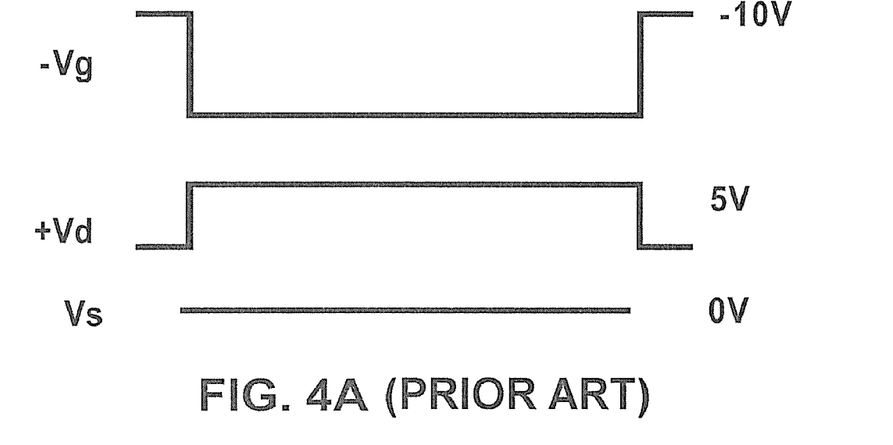
FIG. 4A and FIG. 4B are timing diagrams of the voltages applied to the control gate and source/drain region according to conventional methods for erasing.
Figure 4B:
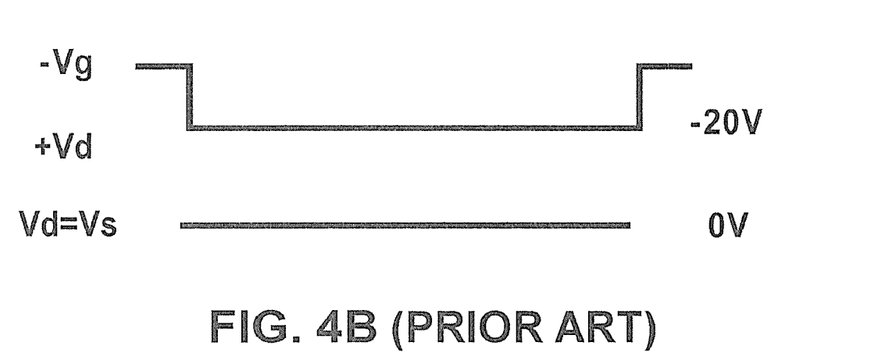
Figure 4C:
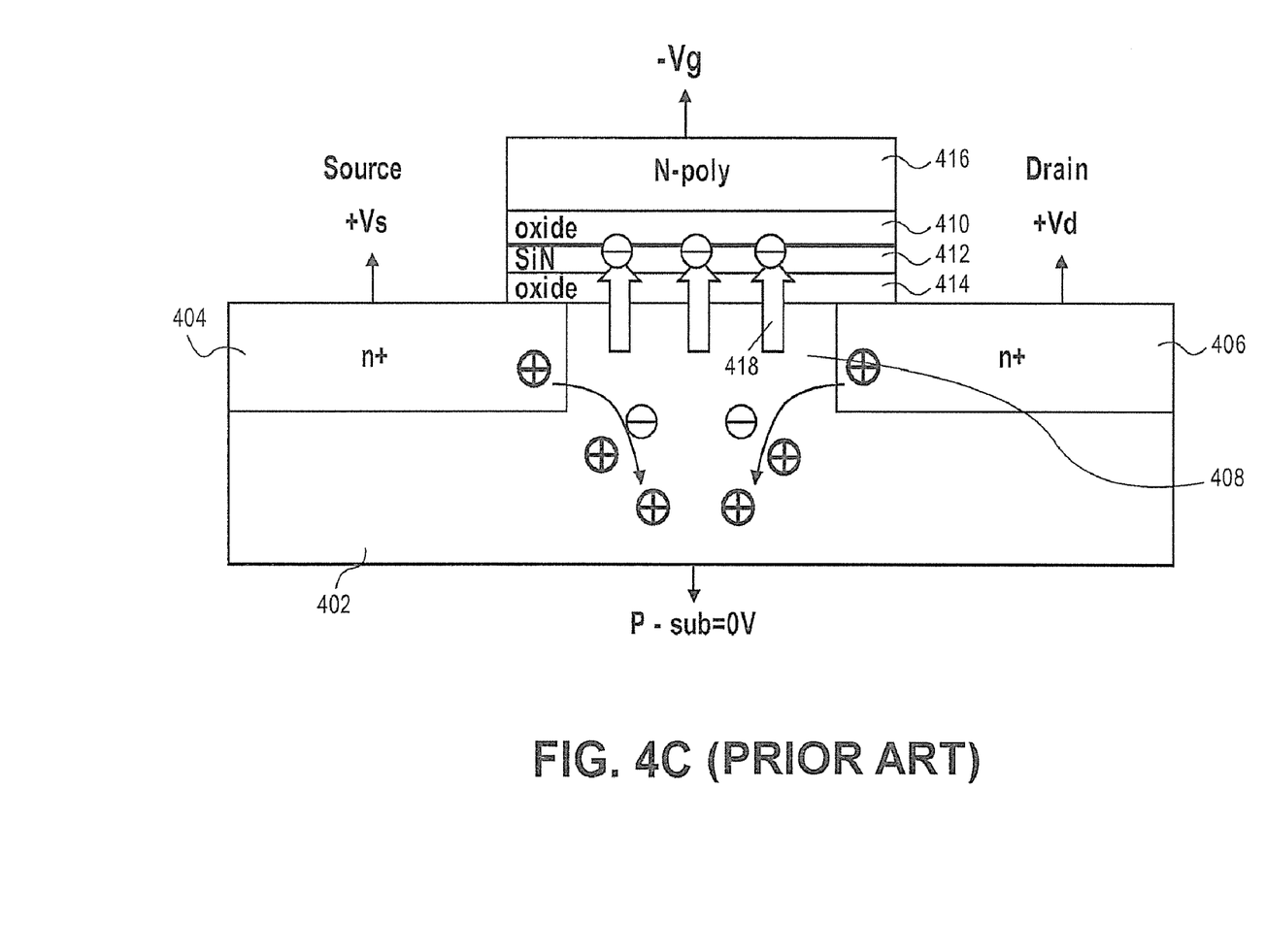
FIG. 4C illustrates a cross-sectional view of a memory device during a conventional erasing operation.

To erase the memory cells, a constant negative voltage may be applied to the control gate using a conventional technique. As shown in FIG. 4A, in a band-to-band hot hole tunneling (BTBHHT) injection method, a memory cell is erased by applying a constant negative voltage (e.g., −10V) to the control gate, applying a constant positive voltage (e.g., 5V) to the drain region and grounding the source region. An erasing operation may also be accomplished by Fowler-Nordheim (FN) injection with reference to FIG. 4B. For example, a constant negative voltage (e.g., −20V) is applied to the control gate 416 and both the source 404 and the drain 406 are grounded. Since the control gate 416 is negatively biased, holes are attracted into the nitride layer 412, which is indicated by direction arrows 418 in FIG. 4C. When the holes are attracted into the nitride layer 412, the memory cell is erased.

As with programming operations, the erasing speed of the memory cells may also vary from memory cell to memory cell depending on the fabricating process. Accordingly, the wide erased threshold voltage distribution may cause some memory cells to become over-erased before other cells become sufficiently erased. The over-erased cells may then have a neutral or even slightly positive charge, which turns the over-erased cells into depletion mode transistors that cannot be turned off by applying normal operating voltages to the control gates, and may therefore introduce leakage current flowing through the source region, the channel region, and the drain region to the bit line. Since the drain regions of multi-level memory cells are generally connected to a common bit line, an unselected cell in the same bit line may have an excessive leakage current which may result in incorrectly programming or reading during the subsequent program and read operations. Therefore, there is a need for controlling the threshold voltage distributions to prevent over-erasing and to provide more reliable subsequent program and read operations.

However, the constant voltage applied to the control gate may make it difficult to control the threshold voltage distribution. For example, when the programming operation starts, a relatively high voltage raised on the nitride layer may attract electrons into the nitride layer. Along with the electrons accumulating in the nitride layer, the voltage on the nitride layer is decreased. Since the voltage applied to the control gate is kept positive and constant, a reduced voltage between the nitride layer and the source region may slow the injection of electrons. As a consequence, the slower rate of the injection causes the memory device to take a longer time to program, which therefore results in a wide threshold voltage distribution.

Figure 5:
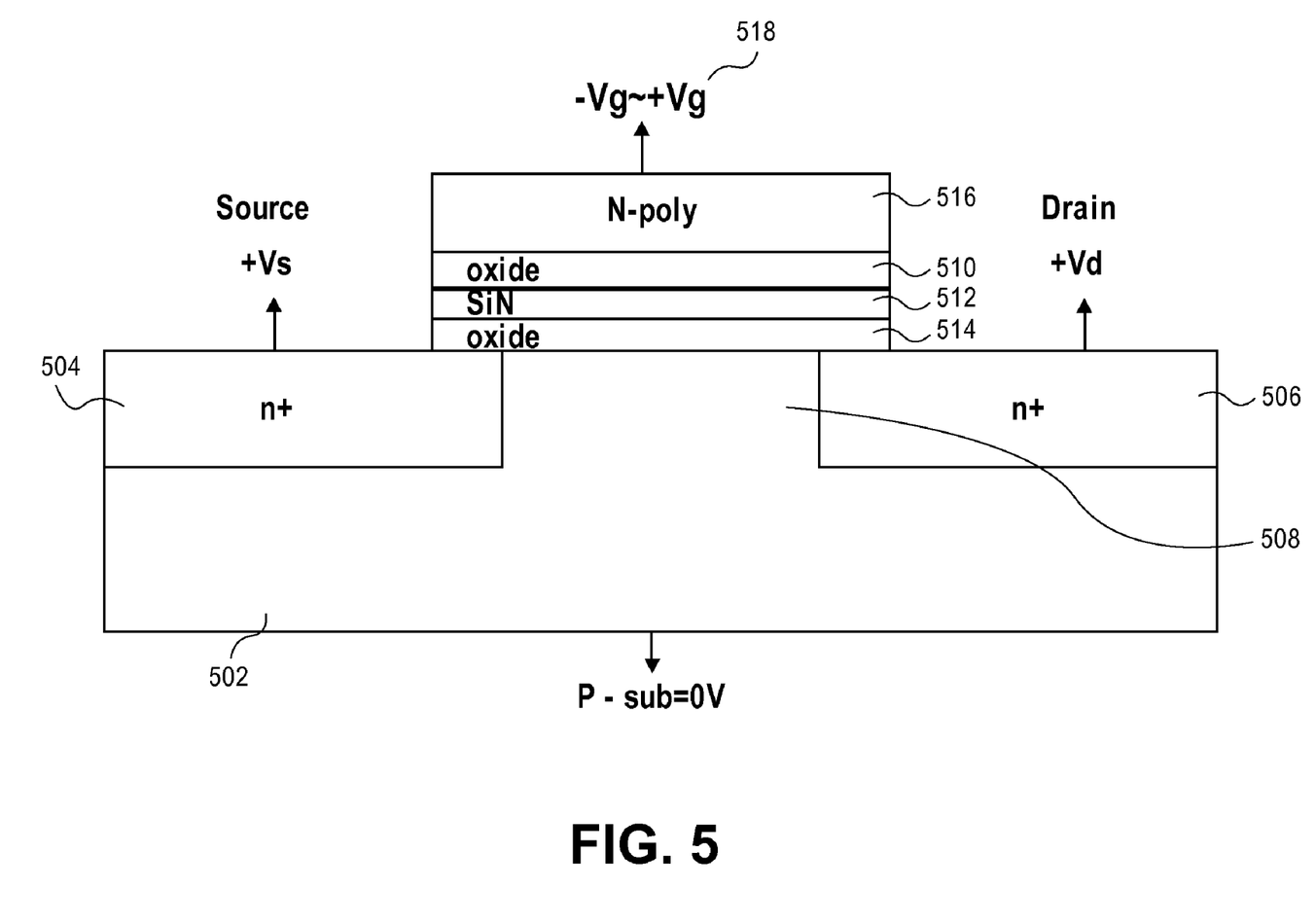
FIG. 5 illustrates cross-sectional view of a memory device during a programming operation according to one example embodiment of the invention.
Figure 6A:
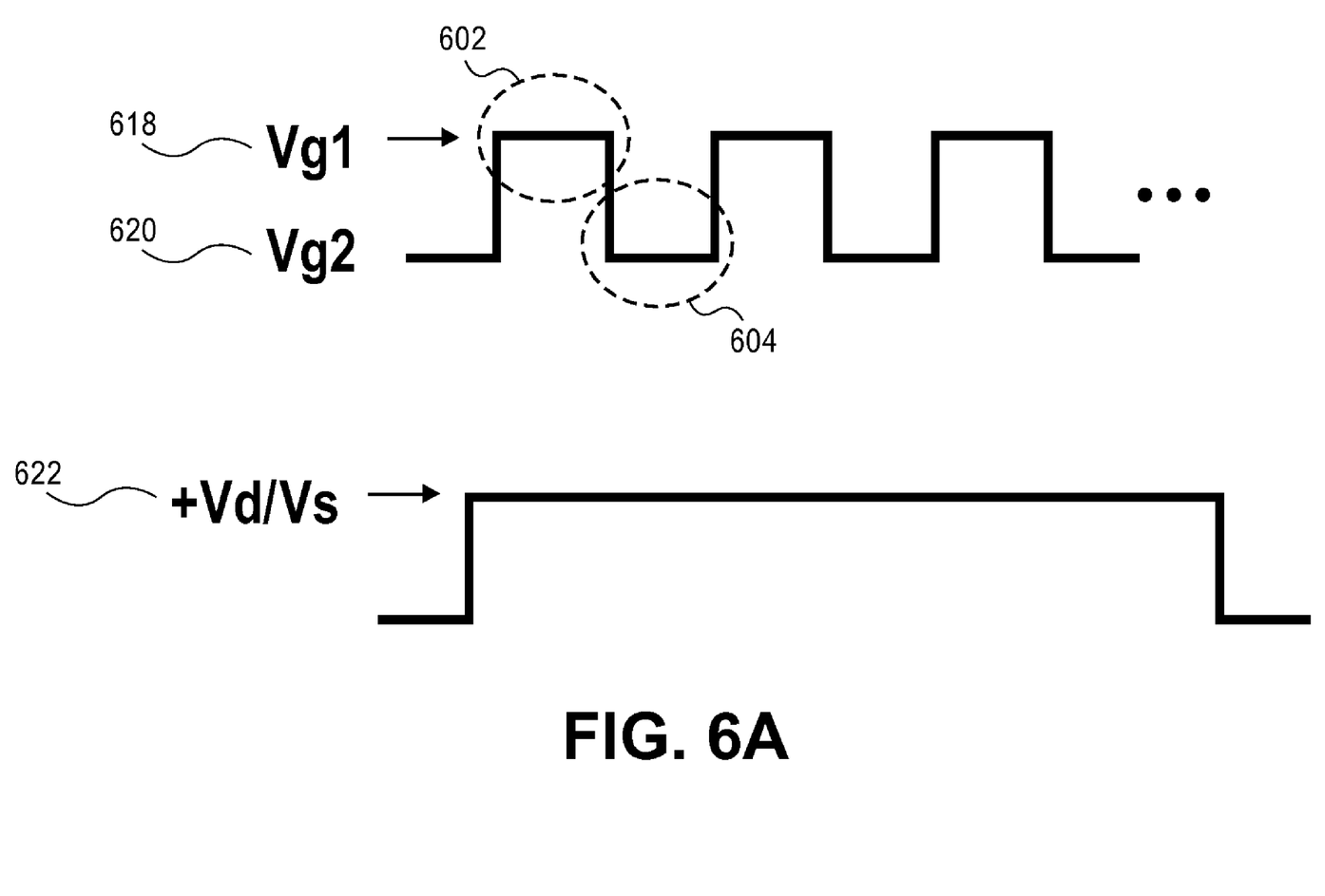
FIG. 6A is a timing diagram of the voltages applied to the control gate and source/drain region during a programming operation according to one method of the invention.

In contrast to applying constant operating voltages to the control gate during the programming operation, applying one constant positive voltage for one period followed by applying another lower or negative constant voltage for another period repeatedly may provide a narrow threshold voltage distribution and therefore prevent the memory cells from becoming over-programmed. FIG. 5 illustrates a cross-sectional view of a memory device during a programming operation according to one example embodiment of the invention. Referring to FIG. 5 and FIG. 6A, a positive voltage 618 (e.g., between 8V and 12V) and a lower or negative voltage 620 (e.g., a voltage between −2V and 2V) may be applied to the control gate 516 alternatively and cyclically.

In one example embodiment, the voltages are applied to the memory cell according to the timing diagram shown in FIG. 6A. A constant voltage 618 in a range such as, for example, of 8V and 12V is applied to the control gate 516. Simultaneously, another constant voltage such as, for example, 622, in a range from 5V to 7V, may be applied to the drain region 506 in an example of programming a single bit memory cell, while grounding the source region 504. In an example of programming a 2-bit memory cell, both the drain region 506 and the source region 504 may be activated at a constant voltage such as, for example, in the range of 5V to 7V.

According to the programming process described above, a number of electron-hole pairs may be generated by the impact ionization in the channel region 508. Due to the voltage difference between the nitride layer 512 and the drain region 506, electrons flow through the channel region 508 and are injected into the nitride layer 512. If the constant voltage is kept at the control gate 516, as described above, it may slow the rate of the electron injection and may yield a wide threshold voltage distribution which causes the fastest memory cells to become over-programmed. Therefore, in one example embodiment, the programming operation is interrupted before the fastest memory cells are over-programmed by stopping applying the voltage 618 and starting applying a voltage 620 to the control gate 516 (e.g., a voltage between — 2V and 2V). The voltage 620 is lower than the voltage 622 which is applied to the drain region 506. Since the voltage 620 applied to the control gate 516 is lower than the voltage 622 on the drain region, holes may be attracted to the nitride layer 512 and then may compensate some electrons previously trapped there. Then the threshold voltage is raised to a desired level again due to the charge removal. As a result, the rate of electron injection is increased and the fastest memory cells may not be over-programmed.

After compensating the electrons trapped in the floating gate with holes, the voltage 618 is applied to the control gate 516 again to resume the programming process. The voltage 618 and voltage 620 may constitute a cycle and be applied to the control gate 516 repeatedly, which as a result, may narrow the threshold voltage distribution and avoid over-programming of memory cells. In a preferred embodiment, the application of the voltage 618 for programming and the voltage for compensating may last for the same period of between 1 microsecond and 1 millisecond. In an alternative embodiment, the period for programming and compensating may be different.

Figure 6B:
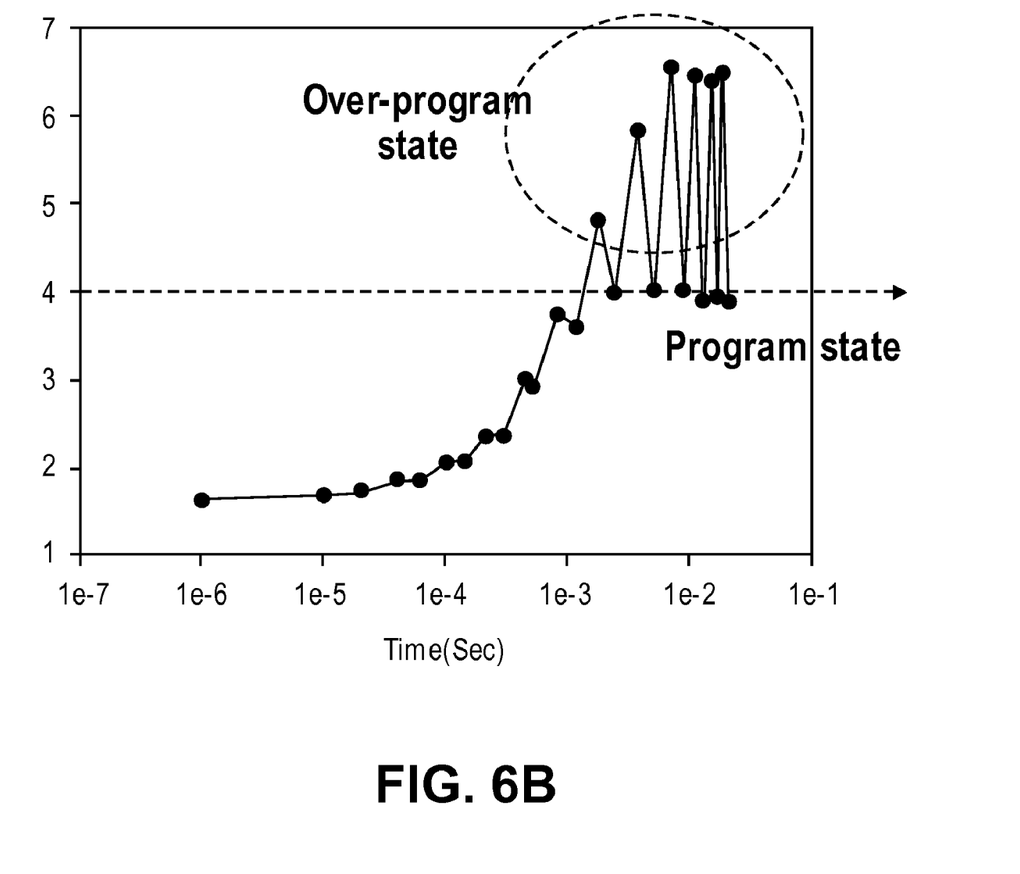
FIG. 6B shows an experimental threshold voltage distribution according to an exemplary programming technique as shown in FIG. 6A.

FIG. 6B shows an experimental threshold voltage distribution according to the exemplary programming technique of the invention. The narrow threshold voltage distribution in this example embodiment is achieved by applying approximately 10V to the control gate 516 for a period of programming and immediately after interrupting the programming process, applying approximately 0V to the control gate 516 for compensating, and keeping both the drain region 506 and the source region 504 at approximately 5.5V. The embodiments assume that the voltages to the control gate 516, the voltages to the drain region 506 and the source region 504 are applied simultaneously.

During the erasing operation, as a constant negative voltage is applied to the control gate during the erasing operation, the holes are trapped in the nitride layer, which may reduce the absolute value of the voltage between the nitride layer and the source region. As a result, the rate of hole injection becomes slow. Since the control gate is kept at a negative constant voltage during the whole erasing operation, the reduction of the voltage between the nitride layer and the source region, in turn, causes a slower hole movement to the nitride layer. This phenomenon attempts to widen the threshold voltage distribution.

In a similar manner, applying one constant negative voltage for one period followed by applying another constant voltage whose absolute value is lower than the voltage applied to the drain and the source regions repeatedly may provide an erasing mechanism to prevent the memory cells from over-erasing. Referring back to FIG. 5, the control gate 516 may be coupled to a negative voltage 718 (e.g., between −12V and −8V, not shown) and another voltage 720 (e.g., a voltage between −2V and 2V, not shown) alternatively and cyclically.

In one example embodiment of an erasing operation, the voltages are applied to a memory cell according to the timing diagram shown in FIG. 7A, with reference again to FIG. 5. In this embodiment, a constant negative voltage 718 in a range from −12V to −8V is applied to the control gate 516 for a period of time 702. Simultaneously, another constant voltage, in a range from 5V to 7V, may be applied to the drain region 506 while grounding the source region 504 if a single bit memory cell is programmed. In an alternative embodiment, both the drain region 506 and the source region 504 are coupled to the constant voltage which is between 5V and 7V.

Figure 7A:
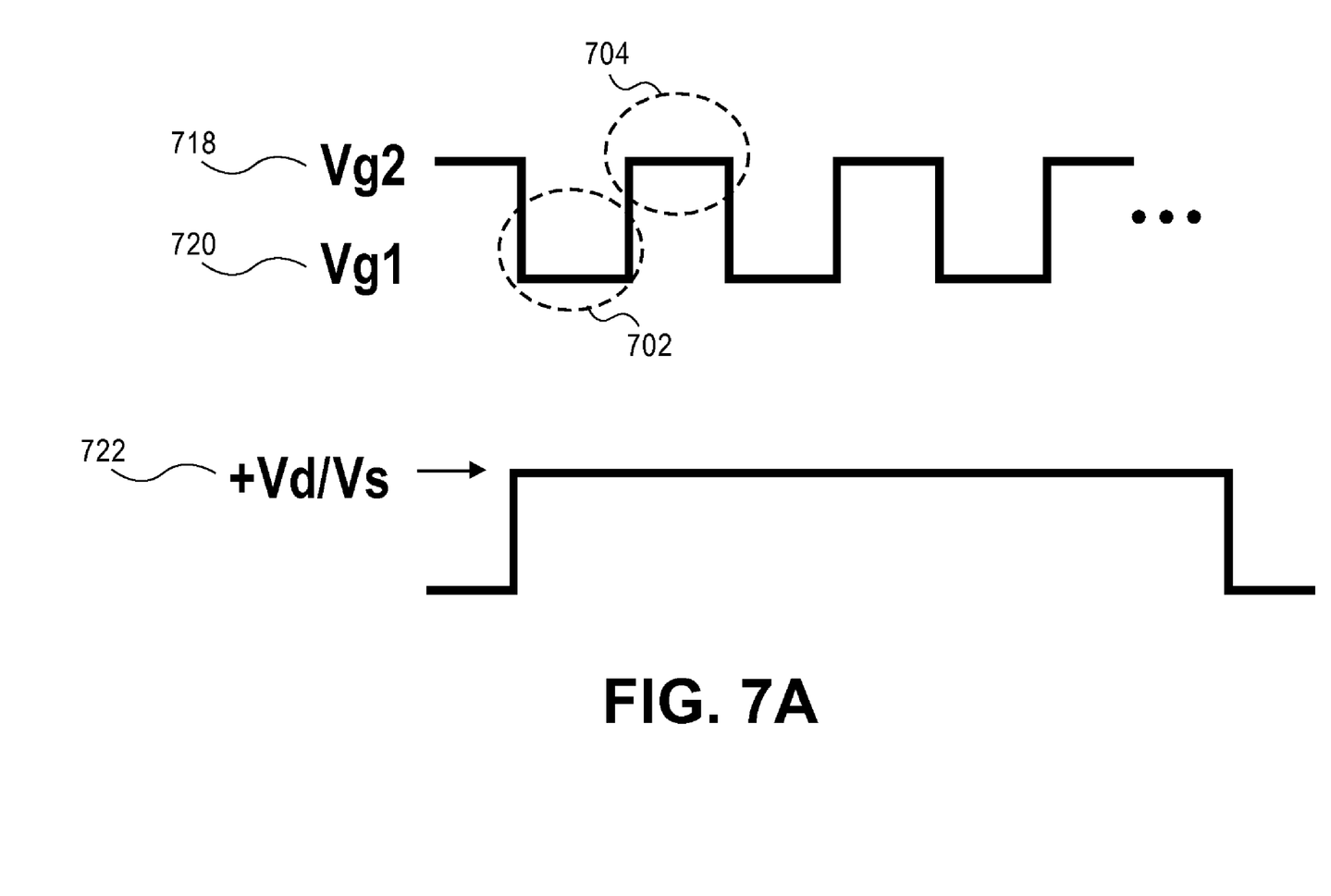
FIG. 7A is a timing diagram of the voltages applied to the control gate and source/drain region during an erasing operation according to one method of the invention.

According to the erasing process described above, due to the difference of the absolute value between the voltages on the nitride layer 512 and the drain region 506, holes are attracted to the nitride layer 512. If the constant voltage is kept at the control gate 516, as described above, the fastest memory cell may be over-erased. The over-erased memory cells may have very low or even positive voltage on their nitride layer 512 and may be always on as depleted transistors, which results in an erroneous reading operation. As a consequence, the method of interrupting the erasing operation before the threshold voltage of the fastest memory cells go down and become negative may be employed. In one example embodiment, similarly like the programming technique according to the example embodiment of the invention described above, the erasing voltage 718 is temporarily stopped and another voltage 720 is applied to the control gate 516 for a period of time 704. In this embodiment, the absolute value of the voltage 720 (e.g., a voltage between −2V and 2V) is lower than the voltage 722 applied to the drain region 506. Since the voltage applied to the control gate 516 is higher than the voltage on the drain region, electrons may be injected into the nitride layer 512 and then may combine with holes which are previously attracted there. Thus a desired threshold voltage is recovered due to the charge injection. As a consequence the fastest memory cells may not be over-erased.

After combining electrons with the holes attracted in the nitride layer, the voltage 718 is applied to the control gate 516 again to resume the erasing process. The voltage 718 and the voltage 720 may constitute a cycle and be applied to the control gate 516 repeatedly, with the result that the threshold voltage on the nitride layer 512 may not go down to zero which prevents the leakage current from flowing to the bit line. In a preferred embodiment, the application of the voltage 718 for erasing and the voltage 720 for recovering may last for the same period of between 1 microsecond and 1 millisecond. In an alternative embodiment, the period for programming and compensating may be different.

Figure 7B:
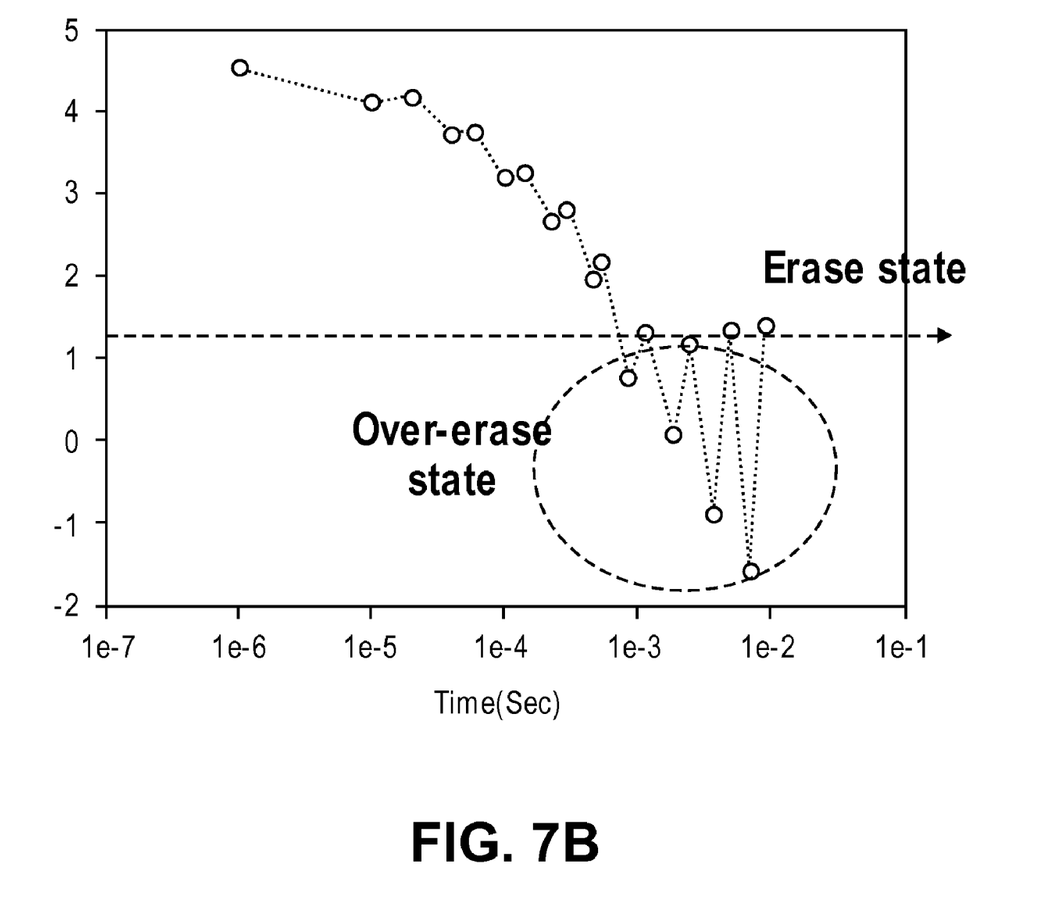
FIG. 7B shows an experimental threshold voltage distribution according to an exemplary erasing technique as shown in FIG. 7A.

FIG. 7B shows an experimental threshold voltage distribution according to the exemplary erasing technique of the invention. In a preferred embodiment, approximately −10V is applied to the control gate 516 for a period of erasing and immediately after interrupting the erasing process, approximately 0V is applied to the control gate 516 for recovering, and approximately 5.5V is applied to both the drain region 506 and the source region 504. The embodiments assume that the voltages to the control gate 516, the voltages to the drain region 506 and the source region 504 are applied simultaneously.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

I claim:

1. A method for performing operations on a memory cell, the memory cell including a first doping region and a second doping region, a conductive gate formed over the first doping and the second doping region, the method comprising:
    applying a first constant voltage for a first period to the conductive gate followed by applying a second constant voltage for a second period to the conductive gate repeatedly, wherein the value of the first constant voltage is different from the value of the second constant voltage;
    applying a third constant voltage to the first doping region; and
    applying a fourth constant voltage to the second doping region,
    wherein at least one of the third constant voltage and the fourth constant voltage is between about 5V and 7V.

2. The method of claim 1, wherein at least one of the first period and the second period is between about 1 microsecond and 1 millisecond.

3. The method of claim 1, wherein the first constant voltage applied to the conductive gate is between about 8V and 12V during a programming operation.

4. The method of claim 1, wherein the first constant voltage applied to the conductive gate is between about −12V and −8V during an erasing operation.

5. The method of claim 1, wherein the second constant voltage applied to the conductive gate is between about −2V and 2V.

6. The method of claim 3, wherein the second constant voltage applied to the conductive gate is between about −2V and 2V.

7. The method of claim 6, wherein at least one of the third constant voltage and the fourth constant voltage is between about 5V and 7V.

8. The method of claim 4, wherein the second constant voltage applied to the conductive gate is between about −2V and 2V.

9. The method of claim 8, wherein at least one of the third constant voltage and the fourth constant voltage is between about 5V and 7V.

10. The method of claim 1, wherein one of the third constant voltage and the fourth constant voltage is ground potential.

11. A method for performing operations on a memory cell, the memory cell comprising a first doping region and a second doping region a conductive gate formed over the first doping region and the second doping region, the method comprising:
applying a first constant voltage for a first period followed by applying a second constant voltage for a second period to the conductive gate repeatedly, wherein the value of the first constant voltage is different from the value of the second constant voltage;
applying a third constant voltage to the first doping region; and
applying a fourth constant voltage to the second doping region.

12. The method of claim 11, wherein one of the third constant voltage and the fourth constant voltage is ground potential.

13. The method of claim 11, wherein at least one of the first period and the second period is between about 1 microsecond and 1 millisecond.

14. The method of claim 11, wherein the first constant voltage applied to the conductive gate is between about 8V and 12V during a programming operation.

15. The method of claim 11, wherein the first constant voltage applied to the conductive gate is between about −12V and −8V during an erasing operation.

16. The method of claim 11, wherein the second constant voltage applied to the conductive gate is between about −2V and 2V.

17. The method of claim 11, wherein at least one of the third constant voltage and the fourth constant voltage is between about 5V and 7V.

18. The method of claim 14, wherein the second constant voltage applied to the conductive gate is between about −2V and 2V.

19. The method of claim 18, wherein at least one of the third constant voltage and the fourth constant voltage is between about 5V and 7V.

20. The method of claim 15, wherein the second constant voltage applied to the conductive gate is between about −2V and 2V.

21. The method of claim 20, wherein at least one of the third constant voltage and the fourth constant voltage is between about 5V and 7V.

* * * * *